(12) United States Patent
Mou et al.

(10) Patent No.: US 11,905,168 B2
(45) Date of Patent: Feb. 20, 2024

(54) MANUFACTURING METHOD OF MINIATURE FLUID ACTUATOR

(71) Applicant: Microjet Technology Co., Ltd., Hsinchu (TW)

(72) Inventors: Hao-Jan Mou, Hsinchu (TW); Hsien-Chung Tai, Hsinchu (TW); Lin-Huei Fang, Hsinchu (TW); Yung-Lung Han, Hsinchu (TW); Chi-Feng Huang, Hsinchu (TW); Chang-Yen Tsai, Hsinchu (TW); Wei-Ming Lee, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 715 days.

(21) Appl. No.: 17/072,863

(22) Filed: Oct. 16, 2020

(65) Prior Publication Data
US 2021/0147221 A1  May 20, 2021

(30) Foreign Application Priority Data

Nov. 18, 2019 (TW) ................................ 108141843

(51) Int. Cl.
*B81C 1/00* (2006.01)
*F04B 43/04* (2006.01)
(Continued)

(52) U.S. Cl.
CPC ...... *B81C 1/00182* (2013.01); *B81C 1/00119* (2013.01); *B81C 1/00166* (2013.01);
(Continued)

(58) Field of Classification Search
CPC ............ B81C 1/00182; B81C 1/00119; B81C 1/00166; B81C 2201/013;
(Continued)

(56) References Cited

U.S. PATENT DOCUMENTS 6,422,826 B1 * 7/2002 Sharma .................. F04B 19/24
417/54
6,533,951 B1 * 3/2003 Debar ................... F04B 43/043
216/2
(Continued)

FOREIGN PATENT DOCUMENTS

CN       103282706 A    9/2013
CN       209098182 U    7/2019
(Continued)

*Primary Examiner* — Peter Dungba Vo
*Assistant Examiner* — Jose K Abraham
(74) *Attorney, Agent, or Firm* — Birch, Stewart, Kolasch & Birch, LLP

(57) ABSTRACT

A manufacturing method of miniature fluid actuator is disclosed and includes the following steps. A flow-channel main body manufactured by a CMOS process is provided, and an actuating unit is formed by a deposition process, a photolithography process and an etching process. Then, at least one flow channel is formed by etching, and a vibration layer and a central through hole are formed by a photolithography process and an etching process. After that, an orifice layer is provided to form at least one outflow opening by an etching process, and then a chamber is formed by rolling a dry film material on the orifice layer. Finally, the orifice layer and the flow-channel main body are flip-chip aligned and hot-pressed, and then the miniature fluid actuator is obtained by a flip-chip alignment process and a hot pressing process.

16 Claims, 11 Drawing Sheets

(51) Int. Cl.
  *H10N 30/067* (2023.01)
  *H10N 30/081* (2023.01)
  *H10N 30/082* (2023.01)
  *F16K 99/00* (2006.01)

(52) U.S. Cl.
  CPC ......... *F04B 43/046* (2013.01); *H10N 30/067* (2023.02); *H10N 30/081* (2023.02); *H10N 30/082* (2023.02); *B81C 2201/013* (2013.01); *B81C 2201/0156* (2013.01); *F16K 99/0048* (2013.01); *F16K 2099/0074* (2013.01); *F16K 2099/0094* (2013.01)

(58) Field of Classification Search
  CPC ........... B81C 2201/0156; F04B 43/046; F04B 43/043; H10N 30/067; H10N 30/081; H10N 30/082; H10N 30/1051; F16K 99/0048; F16K 2099/0074; F16K 2099/0094
  See application file for complete search history.

(56) References Cited

U.S. PATENT DOCUMENTS

| | | | | |
|---|---|---|---|---|
| 8,393,714 B2 * | 3/2013 | Silverbrook | ........... | B41J 2/1623 347/65 |
| 2005/0035983 A1 * | 2/2005 | Cruchon-Dupeyrat | ...................... | G03F 7/0002 346/140.1 |
| 2005/0068725 A1 * | 3/2005 | Houle | ................. | H01L 21/4878 257/E23.098 |
| 2012/0224981 A1 * | 9/2012 | Fouillet | ................. | F04B 43/043 417/63 |
| 2013/0263449 A1 | 10/2013 | Kang et al. | | |
| 2015/0150470 A1 * | 6/2015 | Sano | ................... | A61B 5/0225 600/490 |
| 2015/0345663 A1 * | 12/2015 | Jiang | ................... | F16K 99/0048 29/25.35 |
| 2019/0064134 A1 * | 2/2019 | Mou | ................... | G01N 33/0026 |
| 2019/0067550 A1 | 2/2019 | Mou et al. | | |

FOREIGN PATENT DOCUMENTS

| | | | |
|---|---|---|---|
| DE | 10 2012 212 650 A1 | | 1/2014 |
| TW | M549939 U | * | 10/2017 |
| TW | M552163 U | * | 11/2017 |
| TW | M553479 U | * | 12/2017 |
| TW | M574151 U | | 2/2019 |
| TW | M575806 U | | 3/2019 |
| TW | M580642 U | | 7/2019 |

* cited by examiner

MANUFACTURING METHOD OF MINIATURE FLUID ACTUATOR

FIELD OF THE INVENTION

The present disclosure relates to a manufacturing method of a miniature fluid actuator, and more particularly to a manufacturing method of a miniature fluid actuator produced by utilizing a complementary metal-oxide-semiconductor (CMOS) process with a micro-electromechanical system semiconductor process.

BACKGROUND OF THE INVENTION

Currently, in all fields, the products used in many sectors such as pharmaceutical industries, computer techniques, printing industries or energy industries are developed toward elaboration and miniaturization. The fluid transportation devices are important components that are used in for example micro pumps, micro atomizers, printheads or the industrial printers.

With the rapid advancement of science and technology, the application of fluid transportation device tends to be more and more diversified. For the industrial applications, the biomedical applications, the healthcare, the electronic cooling and so on, even the most popular wearable devices, the fluid transportation device is utilized therein. It is obviously that the conventional fluid transportation devices gradually tend to miniaturize the structure and maximize the flow rate thereof.

However, although the conventional miniature fluid actuator is improved to miniaturize the structure, the bottleneck of the millimeter level is not broken through, and it fails to miniaturize the size of the fluid actuator to the micrometer level. Therefore, how to reduce the size of the fluid actuator to the micrometer level to complete the manufacturing is an important subject developed in the present disclosure.

SUMMARY OF THE DISCLOSURE

An object of the present disclosure is to provide a manufacturing method of a miniature fluid actuator. It is produced by a standard micro-electromechanical system semiconductor process. The miniature fluid actuator is produced by utilizing a semiconductor thin film to achieve fluid transportation. Although the depth of a storage chamber can be controlled in a very shallow range, the fluid compression ratio of the miniature fluid actuator still can be increased at the time of actuation.

In accordance with an aspect of the present disclosure, there is provided a manufacturing method of a miniature fluid actuator. The manufacturing method includes steps of: (a) providing a flow-channel main body produced by a complementary metal-oxide-semiconductor (CMOS) process, wherein an insulation layer is formed by oxidizing a substrate, an oxide layer having a plurality of metal layers stacked therein to define a flow-channel etched region is formed by a deposition process of the CMOS process, and a protective layer is formed outermost by a deposition process of the CMOS process; (b) forming an actuating unit by a deposition process, a photolithography process and an etching process, wherein a lower electrode layer, a piezoelectric actuation layer and an upper electrode layer are sequentially stacked by the deposition process, and the upper electrode layer, the piezoelectric actuation layer and the lower electrode layer are produced by the photolithography process and the etching process sequentially to obtain the actuating unit at a required size; (c) forming at least one flow channel by etching, wherein the at least one flow channel is defined at a bottom of the substrate by an etching process; (d) forming a vibration layer and a central through hole by a photolithography process and an etching process, wherein the vibration layer and the central through hole are defined in the flow-channel etched region of the flow-channel main body by the photolithography process and the etching process; (e) providing an orifice layer, and etching the same to form at least one outflow opening, and roll-forming a dry film material thereon to define a chamber; and (f) flip-chip aligning and hot-pressing the orifice layer, wherein the orifice layer is mounted on the flow-channel main body by a flip-chip alignment process and a hot pressing process, and the chamber is sealed, thereby obtaining the miniature fluid actuator.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 2A:
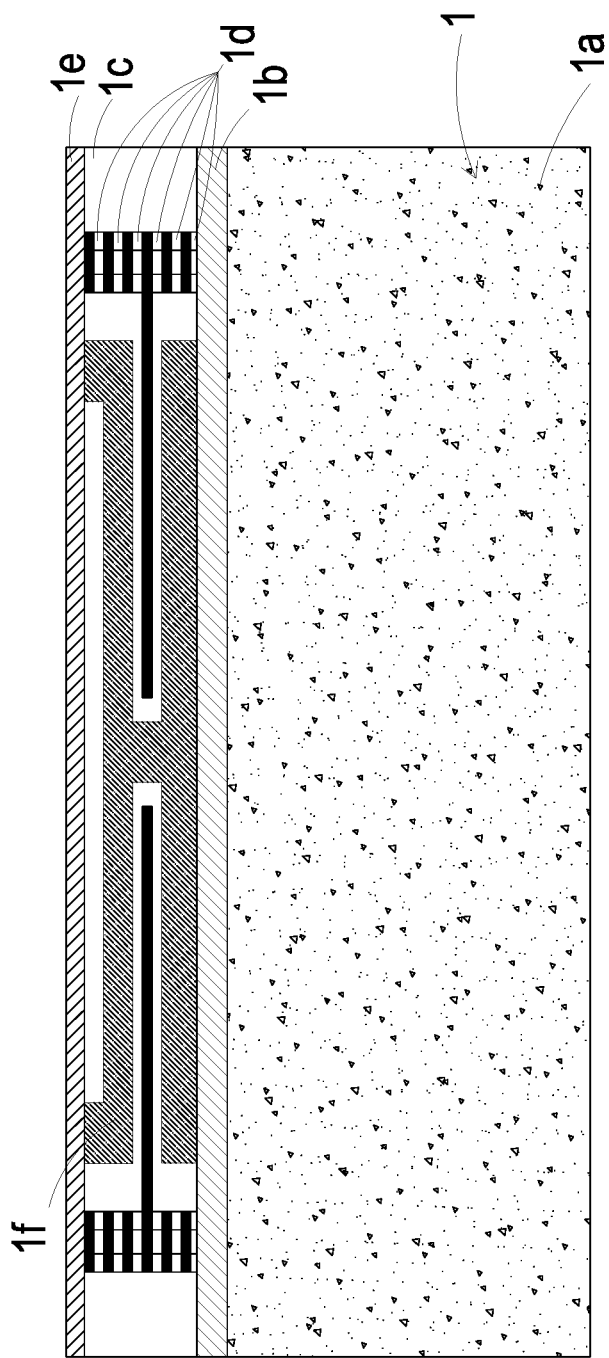
FIGS. 2A to 2F are cross sectional views illustrating the manufacturing process of the miniature fluid actuator according to the first embodiment of the present disclosure.
Figure 2B:
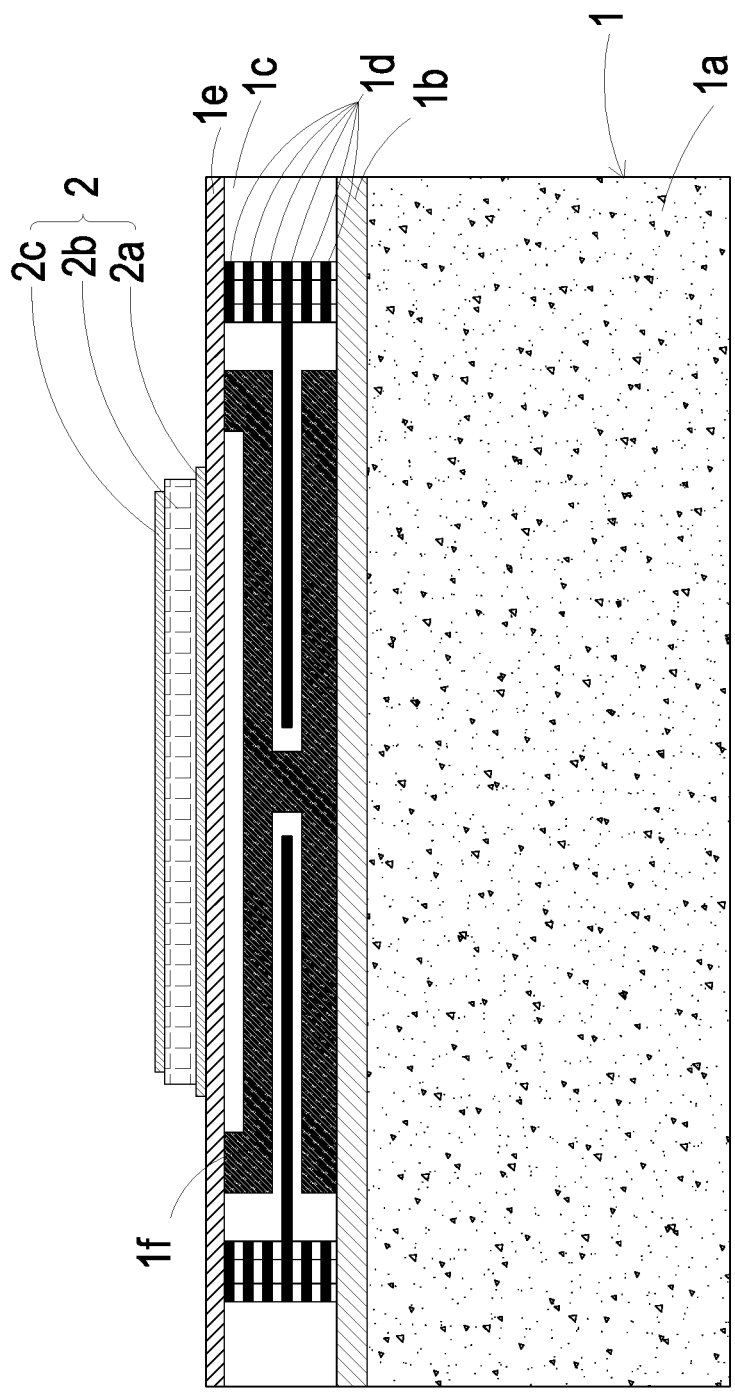
Figure 2C:
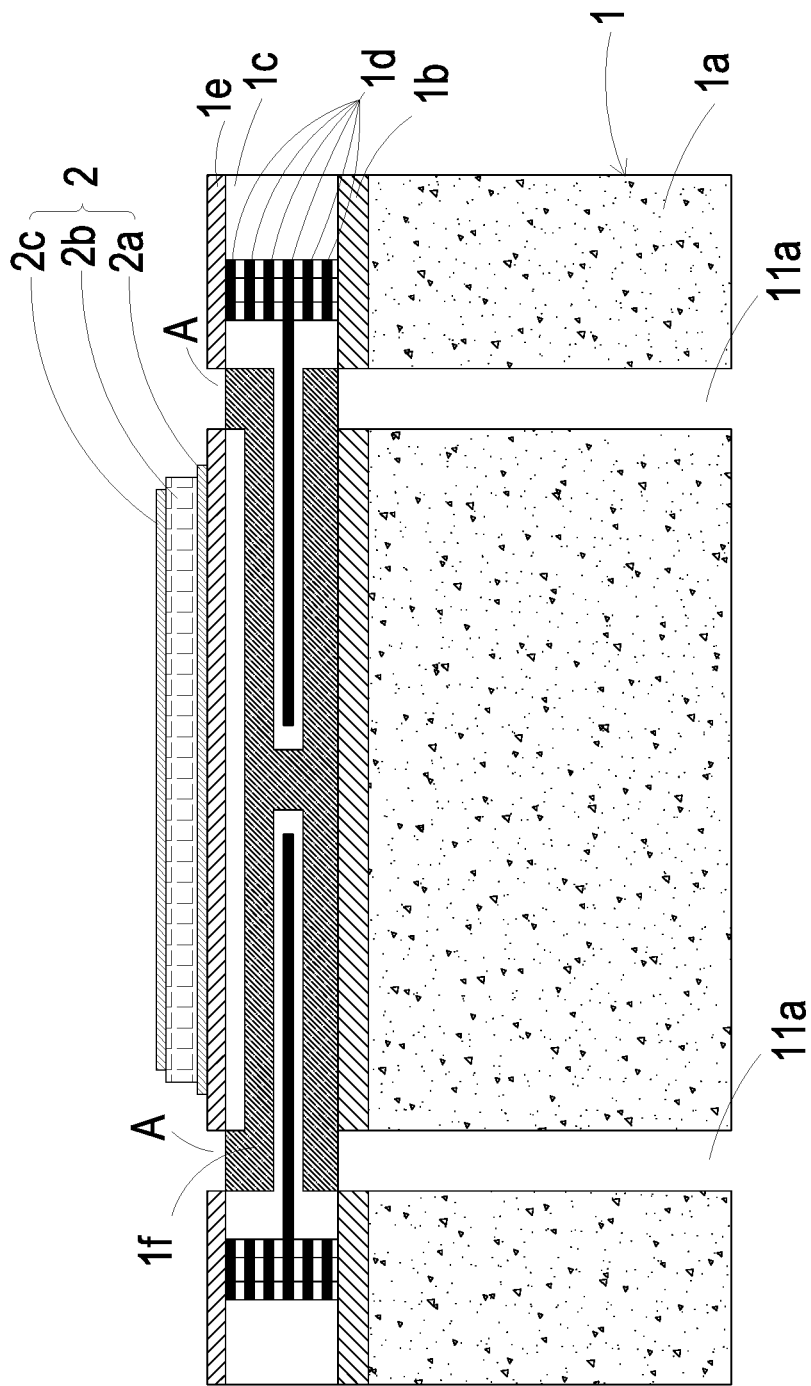
Figure 2D:
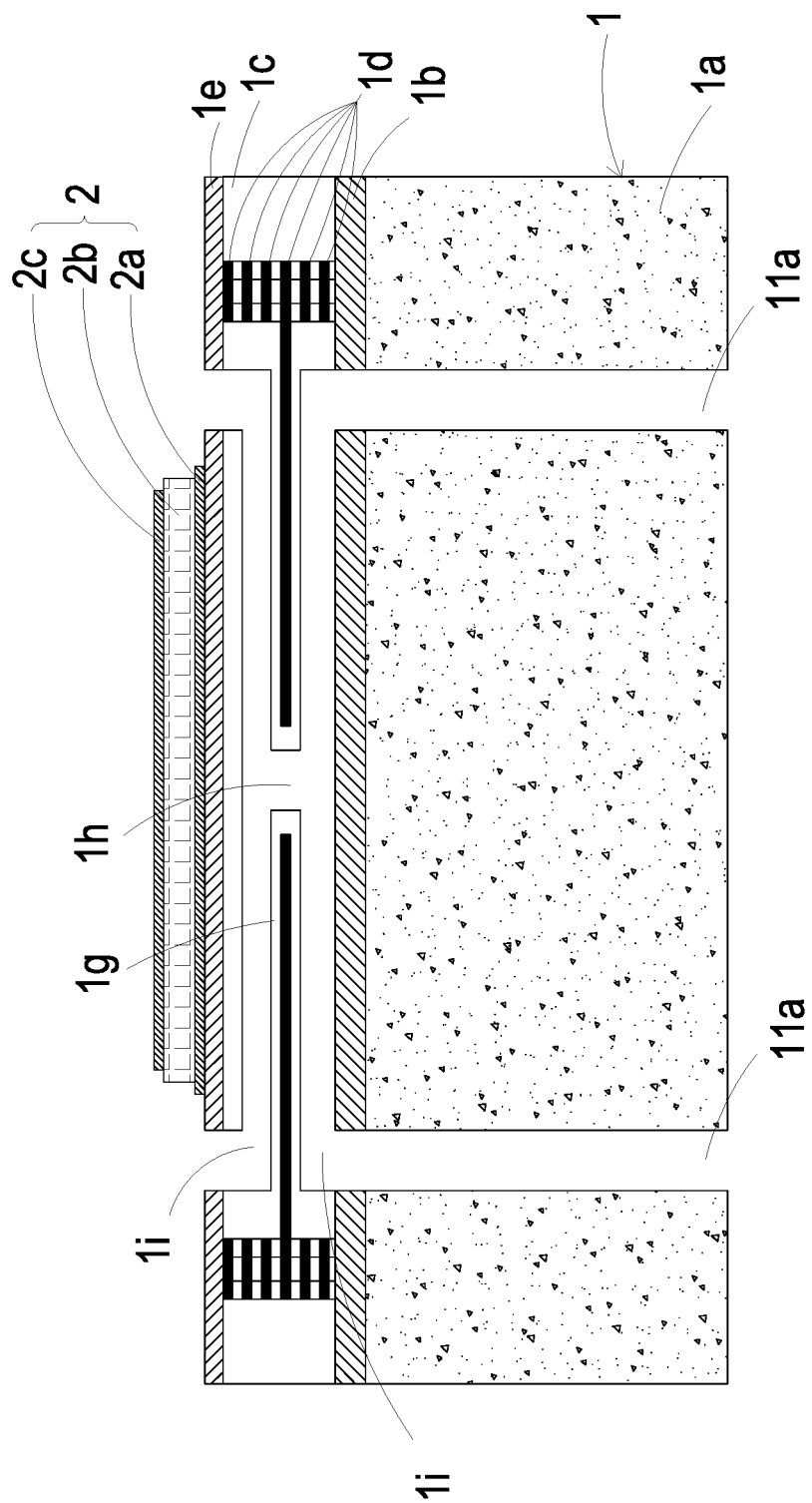
Figure 2E:
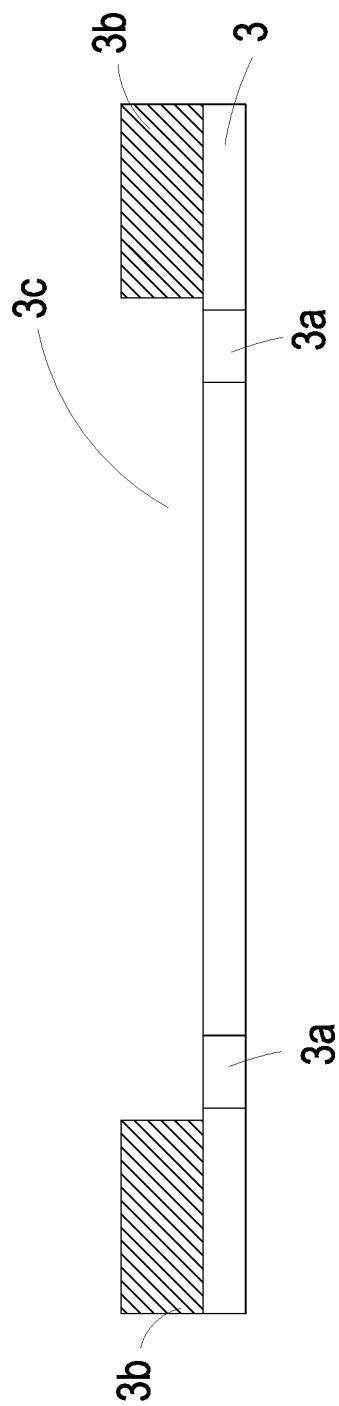
Figure 2F:
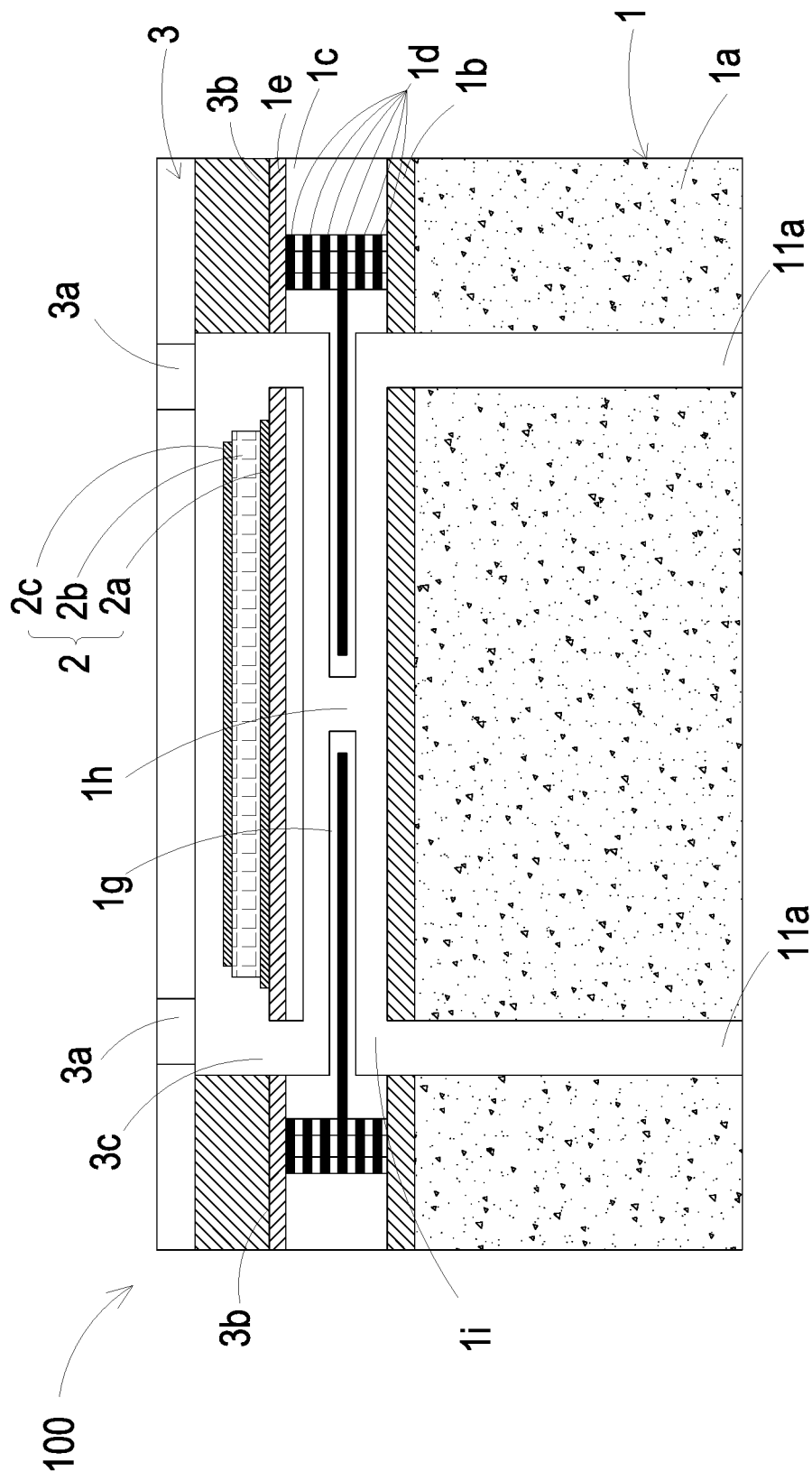

Please refer to FIG. 2F, the present disclosure provides a miniature fluid actuator 100. The micro fluid actuator 100 includes a flow-channel main body 1, an actuating unit 2 and an orifice layer 3. The manufacturing method is described as the following.

Figure 1:
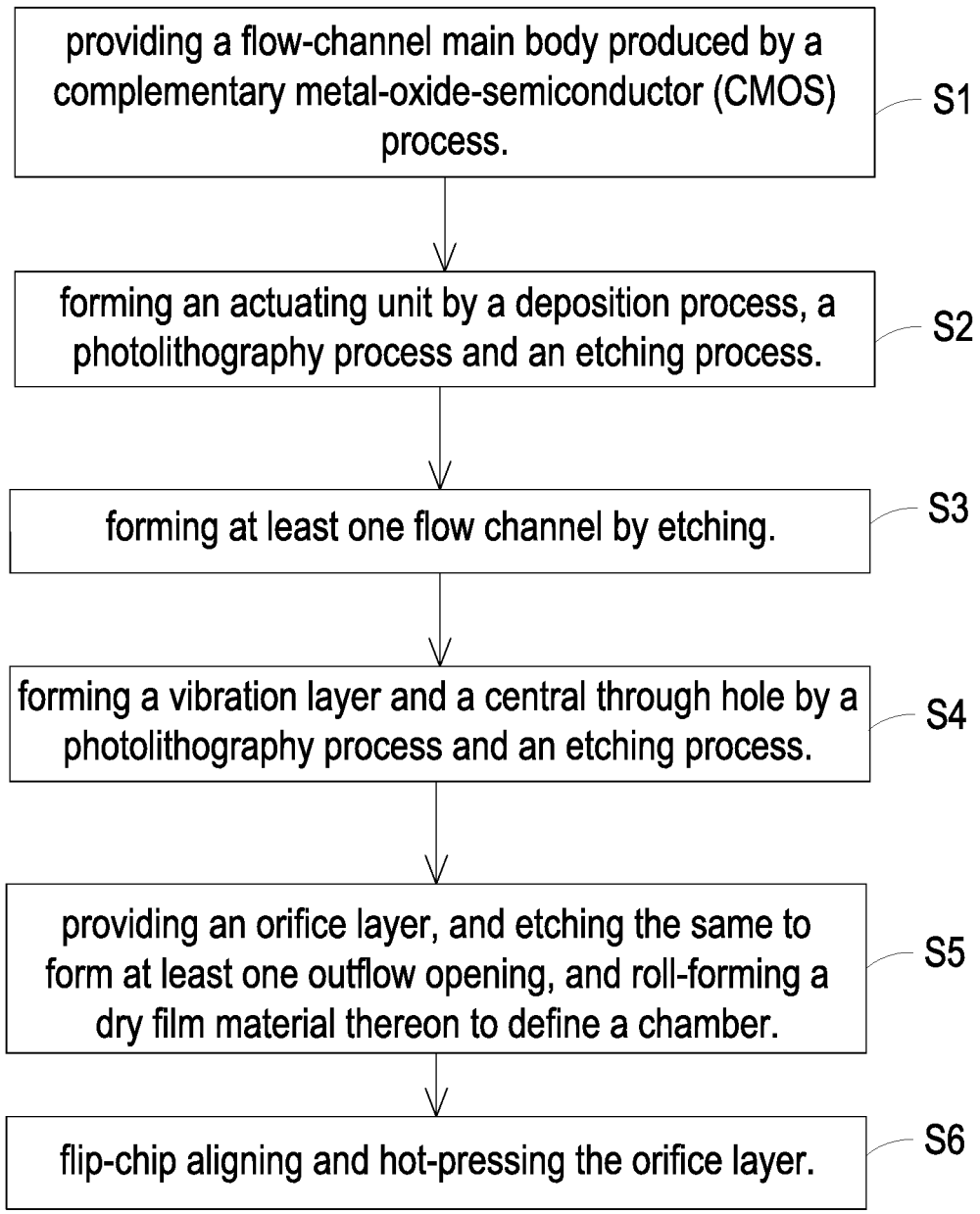
FIG. 1 is a cross sectional view illustrating a miniature fluid actuator according to a first embodiment of the present disclosure.

Please refer to FIG. 1 and FIG. 2A. As shown in a step S1, a flow-channel main body 1 produced by a complementary meta-oxide-semiconductor (CMOS) process is provided. In the embodiment, a substrate a is oxidized to form an insulation layer 1b thereon, and an oxide layer 1c is formed by a deposition process. Preferably but not exclusive, a plurality of metal layers 1d are stacked and disposed within the oxide layer 1c. Consequently, a flow-channel etched region 1f is defined. Thereafter, a protective layer 1e is formed outermost by a deposition process and the flow-channel main body 1 is formed. In the embodiment, the substrate 1a is a silicon substrate. The insulation layer 1b is made of a silicon dioxide material. The present disclosure is not limited thereto. In the embodiment, the flow-channel etched region 1f and the vibration layer 1g (as shown in FIG. 2D) are produced by a deposition process. There are six metal layers 1d stacked and disposed within the oxide layer 1c. Preferably but not exclusively, the deposition process is one selected from the group consisting of a physical vapor deposition (PVD), a chemical vapor deposition (CVD) and a combination thereof. In the embodiment, the protective layer 1e is made of a silicon dioxide ($SiO_2$) material or a silicon nitride ($Si_3N_4$) material. The present disclosure is not limited thereto.

Figure 3:
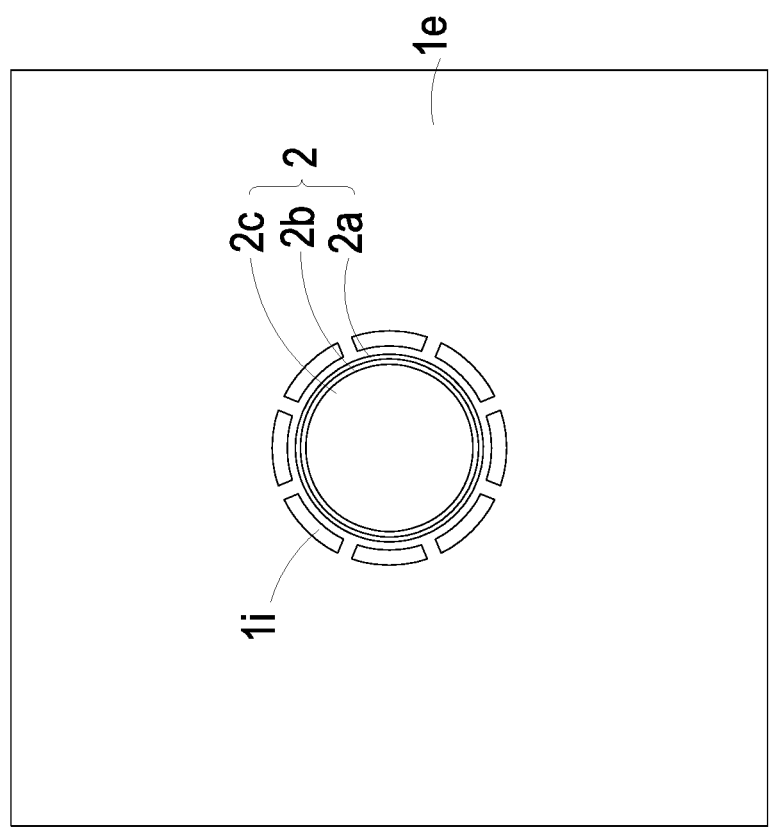
FIG. 3 is a top view of FIG. 2D illustrating the miniature fluid actuator.

Please refer to FIG. 1, FIG. 2B and FIG. 3. As shown in a step S2, an actuating unit 2 is formed by a deposition process, a photolithography process and an etching process. In the embodiment, a lower electrode layer 2a, a piezoelectric actuation layer 2b and an upper electrode layer 2c are sequentially stacked on the protective layer 1e of the flow-channel main body 1 by the deposition process. Then, the lower electrode layer 2a, the piezoelectric actuation layer 2b and the upper electrode layer 2c are produced by the photolithography process and the etching process to obtain the actuating unit 2 at a required size. In the embodiment, the lower electrode layer 2a is formed by depositing a first metal material on the protective layer 1e of the flow-channel main body 1. Thereafter, the piezoelectric actuation layer 2b is formed by depositing a piezoelectric material on the lower electrode layer 2a. Then, the upper electrode layer 2c is formed by depositing a second metal material on the piezoelectric actuation layer 2b. The photolithography process is performed on each of the upper electrode layer 2c, the piezoelectric actuation layer 2b and the lower electrode layer 2a sequentially to define patterns thereof. In the embodiment, the etching process is performed on each of the upper electrode layer 2c, the piezoelectric actuation layer 2b and the lower electrode layer 2a with the patterns thereof. Thus, the actuating unit 2 at the required size is obtained. Preferably but not exclusively, the deposition process is one selected from the group consisting of a physical vapor deposition (PVD), a chemical vapor deposition (CVD) and a combination thereof. Preferably but not exclusively, the first metal material is a platinum material or a titanium material. The present disclosure is not limited thereto. Preferably but not exclusively, the second metal material is a gold material or an aluminum material. It is noted that, in the first embodiment, the etching is at least one selected from the group consisting of wet etching, dry etching and a combination thereof, but the present disclosure is not limited thereto.

Please refer to FIG. 1 and FIG. 2C. As shown in a step S3, at least one flow channel 11a is formed by etching. In the embodiment, a plurality of flow channels 11a are defined at a bottom of the substrate 1a by an etching process. Preferably but not exclusively, the bottom of the substrate 1a is etched to form two flow channels 11a. The etching process for the flow channels 11a is a dry etching. Each flow channel 11a has a required etching depth and penetrates the insulation layer 1b to expose the flow-channel etched region 1f of the main body 1.

Please refer to FIG. 1 and FIG. 2D. As shown in a step S4, a photolithography process and an etching process are performed on the flow-channel etched region if of the flow-channel main body 1 to define a vibration layer 1g and a central through hole 1h. In the embodiment, a protective-layer etched region A (shown in FIG. 2C) is defined by a photolithography process. Then, an etching process is performed on the protective layer 1e to remove the protective-layer etched region A, and the flow-channel etched region 1f of the flow-channel main body 1 is exposed. Thereafter, the flow-channel etched region if of the flow-channel main body 1 is removed by an etching process to define the vibration layer 1g and the central through hole 1h. In the embodiment, the etching process to etch the protective-layer etched region A is a dry etching. In the embodiment, the etching process to produce the vibration layer 1g and the central through hole 1h is a wet etching, which is capable of deep etching. Thus, the flow-channel etched region 1f of the flow-channel main body 1 is etched to form the vibration layer 1g and the central through hole 1h. Moreover, the flow-channel etched region 1f of the flow-channel main body 1 is removed to form a communication channel 1i, which is in fluid communication with the at least one flow channel 1a at the bottom of the substrate Ia. In the embodiment, the central through hole 1h is disposed at a central position of the vibration layer 1g. Preferably but not exclusively, the vibration layer 1g includes a metal layer 1d and an oxide layer 1c, and the metal layer 1d is surrounded by the oxide layer 1c. In this way, the vibration layer g has a better rigid support for driving a vibration operation.

Please refer to FIG. 1 and FIG. 2E. As shown in a step S5, an orifice layer 3 is provided. The orifice layer 3 is etched to form at least one outflow opening 3a, and roll-formed a dry film material 3b thereon to define a chamber 3c. In the embodiment, the at least one outflow opening 3a is formed on the orifice layer 3 by an etching process. The dry film material 3b is roll-formed on two sides of the orifice layer 3, so that the chamber 3c is defined by the dry film material 3b disposed on the two sides. In the embodiment, the orifice layer 3 is etched to form two outflow openings 3a. Preferably but not exclusively, the etching process for the orifice layer 3 is one selected from the group consisting of a wet etching, a dry etching and a combination thereof. The present disclosure is not limited thereto. Preferably but not exclusively, the orifice layer 3 is made by a stainless steel material or a glass material. In the embodiment, the dry film material is a photosensitive polymer dry film. The present disclosure is not limited thereto.

Please refer to FIG. 1 and FIG. 2F. As shown in a step S6, the orifice layer 3 is flip-chip aligned and hot-pressed with the flow-channel main body 1. In the embodiment, the orifice layer 3 is mounted on the flow-channel main body 1 by a flip-chip alignment process and a hot pressing process, and the chamber 3c is sealed, thereby obtaining the miniature fluid actuator 100. In the embodiment, the chamber 3c has a volume defined according to a depth of the orifice layer 3 and the dry film material 3b roll-formed thereon.

Figure 4:
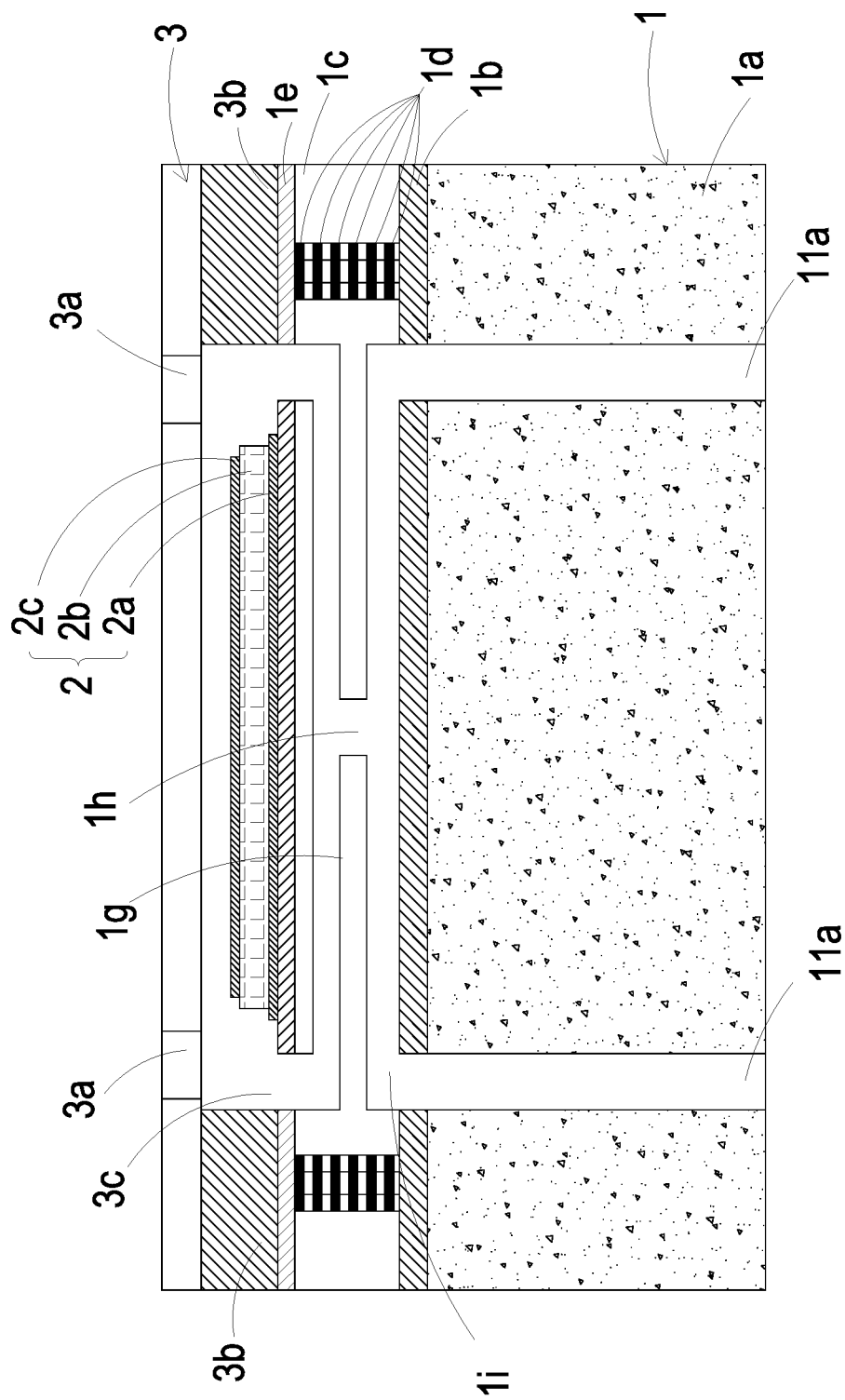
FIG. 4 is a cross sectional view illustrating a miniature fluid actuator according to a second embodiment of the present disclosure.

Notably, as shown in the above step S4, the photolithography process and the etching process are performed on the flow-channel etched region 1f of the flow-channel main body 1 to define the vibration layer 1g and the central through hole 1h. In the embodiment, the vibration layer 1g is adjustable according to the practical requirements. As shown in FIG. 1 and FIG. 4, in the step S, the flow-channel main body 1 is produced by the complementary metal oxide semiconductor (CMOS) process. The oxide layer 1c is formed by the deposition process and the plurality of metal layer 1d are stacked in the oxide layer 1c, so as to define the flow-channel etched region 1f required. In that, the flow-channel etched region 1f of the flow-channel main body 1 is etched and removed through the etching processes in the steps S2 to S4 to produce the vibration layer 1g and the central through hole 1h. In an embodiment, even through the vibration layer 1g shown in FIG. 4 is made by the oxide layer 1c, the driving of the vibration operation can also be implemented through the vibration layer 1g. Preferably but not exclusively, the actual thickness of the vibration layer 1g is adjustable according the practical requirements. In the embodiment, the step S1 is performed to define the flow-channel etched region 1f required. Then, the flow-channel etched region 1f of the flow-channel main body 1 is etched and removed through the etching process in order from the step S2 to the step S4 to produce the vibration layer 1g having the required thickness.

Figure 5A:
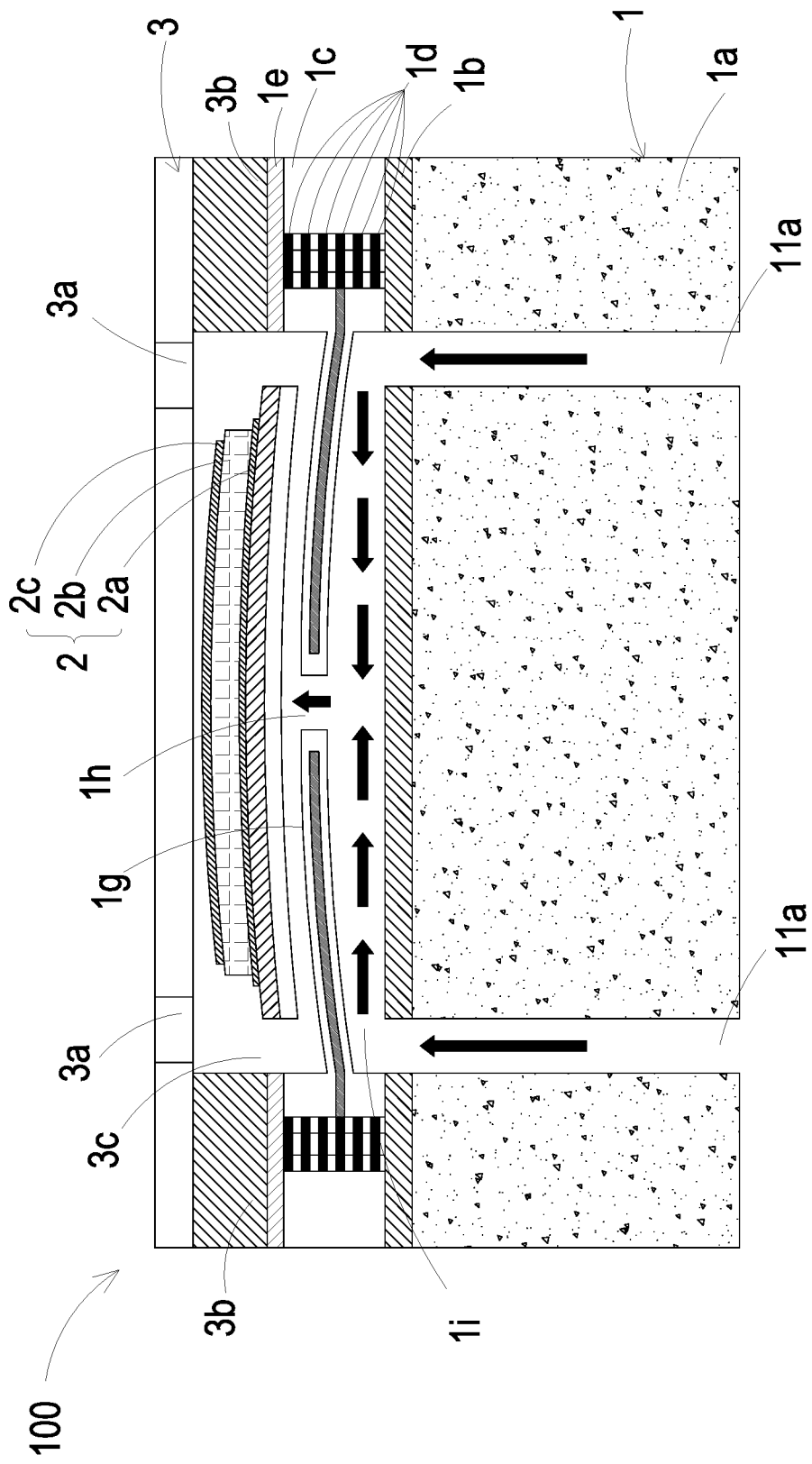
FIGS. 5A to 5B are cross sectional views illustrating actions of the miniature fluid actuator of the present disclosure.
Figure 5B:
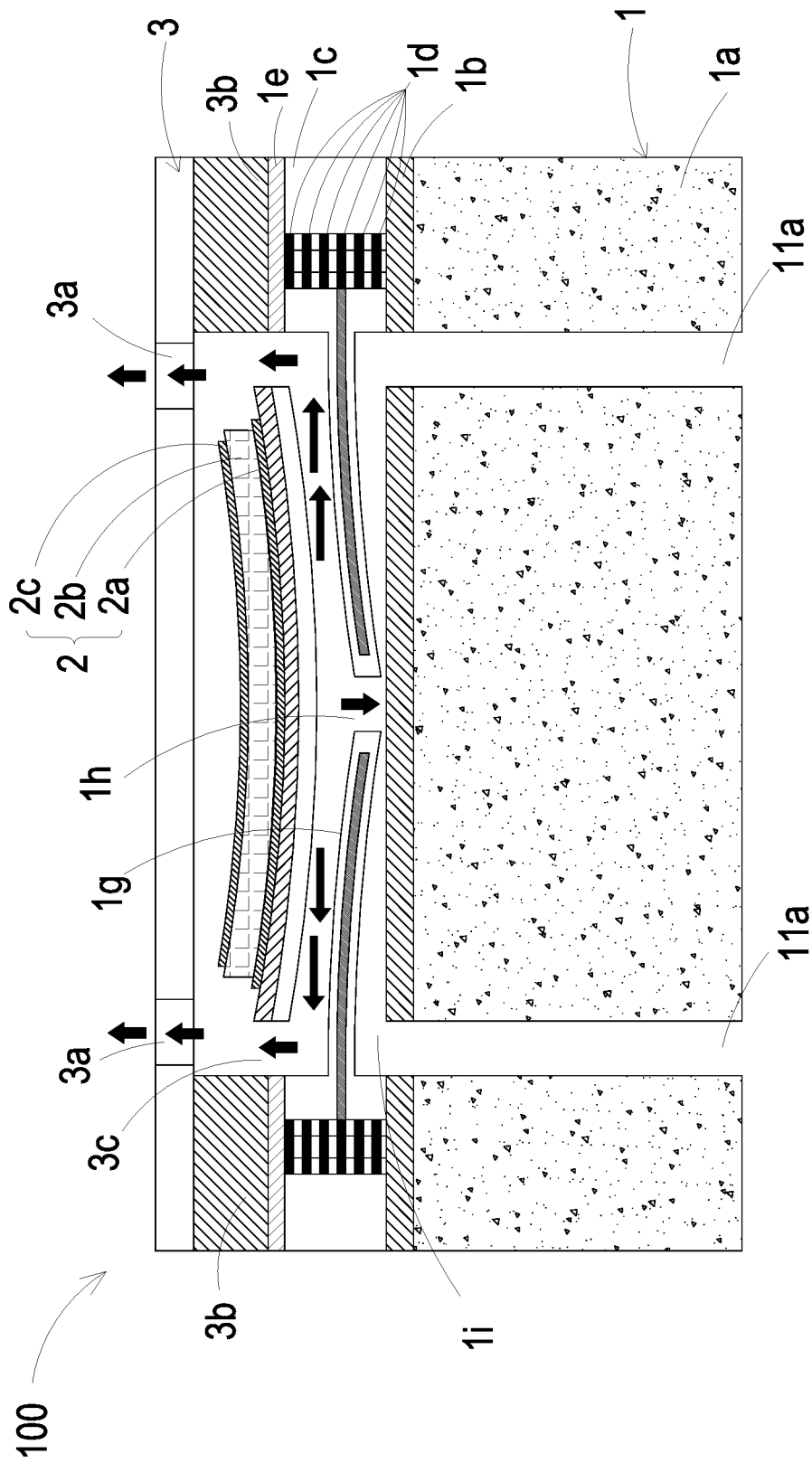

Please refer to FIGS. 5A and 5B. In the first embodiment, the specific operation of the miniature fluid actuator 100 is to provide driving power sources having opposite phases to the upper electrode layer 2c and the lower electrode layer 2a, respectively, to drive and control the vibration layer 1g to displace upwardly and downwardly. As shown in FIG. 5A, when a positive voltage is applied to the upper electrode layer 2c and a negative voltage is applied to the lower electrode layer 2a, the piezoelectric actuation layer 2b drives the vibration layer 1g to displace in a direction away from the substrate Ia. Thus, fluid is inhaled from the exterior into the miniature fluid actuator 100 through the flow channel 11a of the substrate 1a, and the fluid inhaled into the miniature fluid actuator 100 flows through the communication channel 1i, the vibration layer 1g and the central through hole 1h of the flow-channel main body 1 sequentially. Then, the fluid is converged in the chamber 3c. Afterwards, as shown in FIG. 5B, the electrical properties of the upper electrode layer 2c and the lower electrode layer 2a are reversed. A negative voltage is applied to the upper electrode layer 2c and a positive voltage is applied to the lower electrode layer 2a. As so, the piezoelectric actuation layer 2b drives and controls the vibration layer 1g to displace in a direction toward the substrate Ia. The volume of the chamber 3c is compressed by the vibration layer g, and the vibration layer 1g is further displaced in the direction toward the substrate Ia. Thus, the fluid converged in the chamber 3c further flows through at least one outflow opening 3a of the orifice layer 3, and is discharged out of the miniature fluid actuator 100 to achieve fluid transportation.

In summary, the present disclosure provides a manufacturing method of a miniature fluid actuator. The miniature fluid actuator is mainly produced by a CMOS process and a MEMS semiconductor process. By providing driving power sources having different phases to the upper electrode layer and the lower electrode layer, respectively, the vibration layer is driven to displace upwardly and downwardly, so as to achieve fluid transportation. It is extremely valuable for the use of the industry, and it is submitted in accordance with the law.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a miniature fluid actuator comprising steps of:
   (a) providing a flow-channel main body produced by a complementary metal-oxide-semiconductor (CMOS) process, wherein an insulation layer is formed by oxidizing a substrate, an oxide layer having a plurality of metal layers stacked therein to define a flow-channel etched region is formed by a deposition process of the CMOS process, and a protective layer is formed outermost by a deposition process of the CMOS process;
   (b) forming an actuating unit by a deposition process, a photolithography process and an etching process, wherein a lower electrode layer, a piezoelectric actuation layer and an upper electrode layer are sequentially stacked by the deposition process, and the upper electrode layer, the piezoelectric actuation layer and the lower electrode layer are produced by the photolithography process and the etching process sequentially to obtain the actuating unit at a required size;
   (c) forming at least one flow-channel by etching, wherein the at least one flow-channel is defined at a bottom of the substrate by an etching process;
   (d) forming a vibration layer and a central through hole by a photolithography process and an etching process, wherein the vibration layer and the central through hole are defined in the flow-channel etched region of the flow-channel main body by the photolithography process and the etching process;
   (e) providing an orifice layer, and etching the same to form at least one outflow opening, and roll-forming a dry film material on two sides of the orifice layer, and a chamber is defined by the orifice layer and the dry film material disposed on the two sides of the orifice layer; and
   (f) flip-chip aligning and hot-pressing the orifice layer, wherein the orifice layer is mounted on the flow-channel main body by a flip-chip alignment process and a hot pressing process, and the chamber is sealed, thereby obtaining the miniature fluid actuator;
   wherein the step (d) further comprises steps of:
   (d1) defining a protective layer etched region on the flow-channel main body by the photolithograph process;
   (d2) etching the protective layer to remove the protective layer etched region and expose the flow-channel etched region by the etching process; and
   (d3) further removing the flow-channel etched region of the flow-channel main body by the etching process to define the vibration layer and the central through hole, wherein the flow-channel etched region is removed to form a communication channel in fluid communication with the at least one flow-channel at the bottom of the substrate;
   wherein the vibration layer comprises a metal layer and an oxide layer, and the metal layer is surrounded by the oxide layer.

2. The manufacturing method of the miniature fluid actuator according to claim 1, wherein the substrate is a silicon substrate.

3. The manufacturing method of the miniature fluid actuator according to claim 1, wherein the insulation layer is made of a silicon dioxide material.

4. The manufacturing method of the miniature fluid actuator according to claim 1, wherein the protective layer is made of a silicon dioxide material.

5. The manufacturing method of the miniature fluid actuator according to claim 1, wherein the protective layer is made of a silicon nitride material.

6. The manufacturing method of the miniature fluid actuator according to claim 1, wherein the step (b) further comprises steps of:
   (b1) forming the lower electrode layer by depositing a first metal material on the flow-channel main body;

(b2) forming the piezoelectric actuation layer by depositing a piezoelectric material on the lower electrode layer;
(b3) forming the upper electrode layer by depositing a second metal material on the piezoelectric actuation layer;
(b4) performing the photolithography process on each of the upper electrode layer, the piezoelectric actuation layer and the lower electrode layer sequentially to define patterns thereof; and
(b5) performing the etching process on each of the upper electrode layer, the piezoelectric actuation layer and the lower electrode layer with the pattern thereof, to obtain the actuating unit at the required size.

7. The manufacturing method of the miniature fluid actuator according to claim 6, wherein the first metal material is a platinum material.

8. The manufacturing method of the miniature fluid actuator according to claim 6, wherein the first metal material is a titanium material.

9. The manufacturing method of the miniature fluid actuator according to claim 6, wherein the second metal material is a gold material.

10. The manufacturing method of the miniature fluid actuator according to claim 6, wherein the second metal material is an aluminum material.

11. The manufacturing method of the miniature fluid actuator according to claim 1, wherein the vibration layer is made by an oxide layer.

12. The manufacturing method of the miniature fluid actuator according to claim 1, wherein the orifice layer is made by a stainless steel material.

13. The manufacturing method of the miniature fluid actuator according to claim 1, wherein the orifice layer is made by a glass material.

14. The manufacturing method of the miniature fluid actuator according to claim 1, wherein the dry film material is a photosensitive polymer dry film.

15. The manufacturing method of the miniature fluid actuator according to claim 1, wherein the chamber has a volume defined according to a depth of the orifice layer and the dry film material roll-formed thereon.

16. The manufacturing method of the miniature fluid actuator according to claim 1, wherein driving power sources having different phases are provided to the upper electrode and the lower electrode layer, respectively, and the vibration layer is driven to displace upwardly and downwardly, so that fluid is inhaled through the at least one flow-channel at the bottom of substrate, flows through the communication channel, the vibration layer and the central through hole of the flow-channel main body, is converged in the chamber, and then is compressed and discharged out through the at least one outflow opening of the orifice layer to achieve fluid transportation.

* * * * *